United States Patent [19]

Keller

[11] 4,373,397

[45] Feb. 15, 1983

[54] PIEZORESISTIVE PRESSURE CELL

[76] Inventor: Hans W. Keller, St.-Gallerstr. 106, CH-8404 Winterthur, Switzerland

[21] Appl. No.: 229,880

[22] Filed: Jan. 30, 1981

[30] Foreign Application Priority Data

Feb. 6, 1980 [EP] European Pat. Off. ........ 80100603.2

[51] Int. Cl.³ .............................................. G01L 9/06
[52] U.S. Cl. ....................................... 73/721; 73/727; 338/4
[58] Field of Search ................. 73/720, 721, 726, 727, 73/708, DIG. 4; 338/4, 3, 42

[56] References Cited

U.S. PATENT DOCUMENTS 4,173,900 11/1979 Tanabe et al. ........................ 73/727

FOREIGN PATENT DOCUMENTS 129684 2/1978 Fed. Rep. of Germany ........ 73/727

Primary Examiner—Donald O. Woodiel
Attorney, Agent, or Firm—Orrin M. Haugen; Thomas J. Nikolai

[57] ABSTRACT

The pressure cell has a front end cell wall embodied by a metering diaphragm which contains at least one resistor applied by coating and passes over at its backside into an annular cylinder barrel which is closed by a rear cell wall cemented to the same by plastic material adapted to be stressed under elastic elongation and shear. The rear cell wall consists of a material which differs from that of the metering diaphragm. Yet the pressure cell is practically free of any external stress under normal ambient conditions because of the elasticity of the plastic material used for cementing. The pressure cell may be used, for example, in electronic sphygmo-manometers, in carburetors of internal combustion engines for automatic adjustment of the same, and the like. Absolute pressure and reference pressure measurements may be taken. By virtue of the small hysteresis, pressure variations in rapid succession can be measured. The preferred pressure measuring range lies between 0.1 and 2 bar, with pressure ranges up to 1000 bar being permissible as well. Also lower pressure ranges can be achieved.

5 Claims, 1 Drawing Figure

U.S. Patent   Feb. 15, 1983   4,373,397
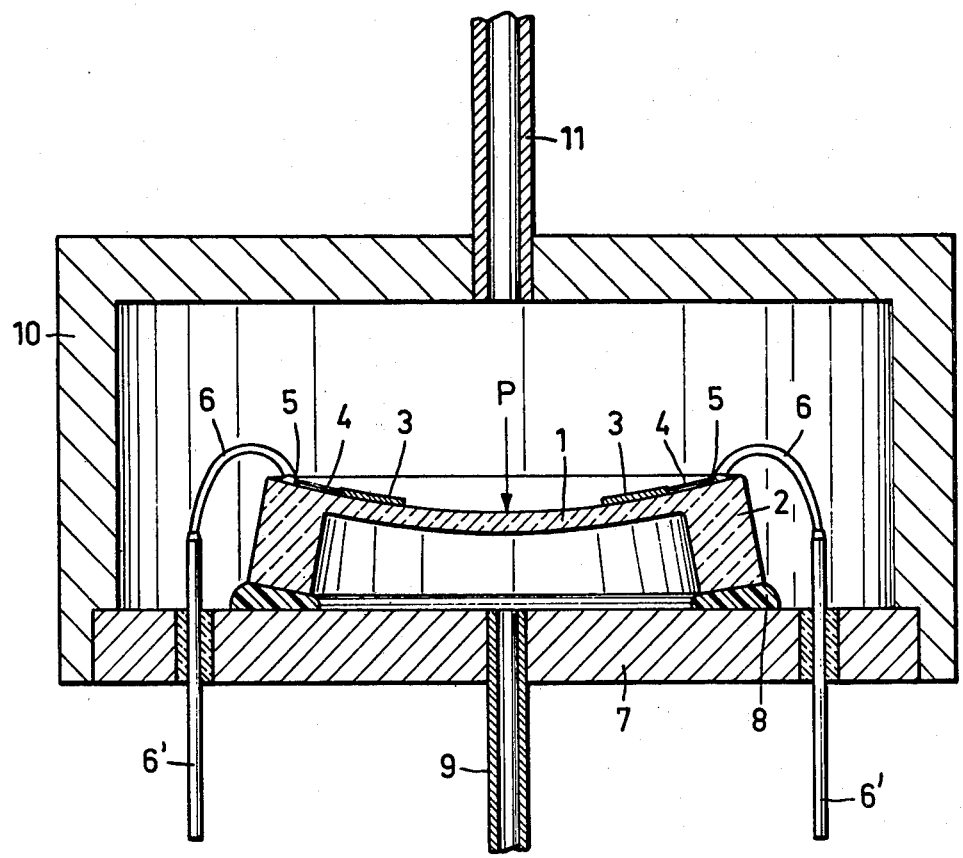

PIEZORESISTIVE PRESSURE CELL

FIELD OF THE INVENTION

The instant invention relates to a piezoresistive pressure cell of circular or polygonal cylindrical shape, having an insulating metering diaphragm which contains at least one measuring resistance and is connected with a rear cell wall by a cylinder barrel formed integral with the diaphragm.

BACKGROUND OF THE INVENTION

In known pressure cells or gauges of this kind the rear cell wall is made of the same or similar solid insulating material as the metering diaphragm, e.g. of silicon or glass in order to obtain largely constant measuring values upon temperature variations, without any superimposed intrinsic spurious signals. The connection between the metering diaphragm and the rear cell wall is established by a fixing material consisting of a gold/silicon eutectic or low melting glass solder. Epoxy resins are also used as fixing material. The fixing procedure takes a long time and is extremely expensive. The surfaces to be bonded together must be smoothed very accurately. Consequently practically no gap is formed between the parts to be joined which normally would attract solder by capillary action when being heated. Therefore, during the soldering process or during the curing of the epoxy resin, the parts to be joined must be moved towards each other rapidly by ultrasonic energy so as to obtain a surface area connection between the front end face of the cylinder barrel and the rear cell wall. If the pressure cell is to be used for reference measurements and the rear cell wall is provided with a passage for communication with a reference pressure fluid, it may further prove necessary to evacuate the interior of the pressure cell during the soldering or curing of the epoxy resin so that the fixing material can be drawn in better from the outside towards the inside. This procedure is complicated still further because, after establishing the connection, the parts must be cooled free of stress so as to avoid any basic deformation of the metering diaphragm since this would impress a spurious signal from the very beginning. However, once all the operating steps have been accomplished perfectly, a high quality pressure cell is obtained which is largely free of hysteresis and can be used also for relatively high pressures or pressure differences (e.g. from 0.1 to 1000 bar), yielding measuring values of great accuracy and largely invariable by temperature influences.

In many cases of application, such as in electronic sphygmo-manometers (non-invasive blood pressure instruments) or for measurements on carburetors of internal combustion engines, and the like, the pressures to be measured lie just a little above or below normal atmospheric pressure, differing from the same by as little as something like ±0.5 bar, and the measuring accuracy required is not very high.

SUMMARY OF THE INVENTION

It is, therefore, an object of the instant invention to provide a pressure cell which is technically simpler than the pressure cell discussed initially, in consideration of the less strict requirements.

It is another object of the instant invention to provide a pressure cell which can be produced at lower cost.

These and other objects which will become apparent as the description proceeds, are met, in accordance with the invention, by a piezoresistive pressure cell of circular or polygonal cylindrical shape, comprising a front end cell wall constituted by a metering diaphragm which contains at least one resistor laminated on or diffused into the same, consists of solid insulating material, and passes over at its back into an annular cylinder barrel thicker than the metering diaphragm, further comprising a rigid rear cell wall at which the cylinder barrel is attached in sealing manner by fixing material applied between the cylinder barrel end face and the rear cell wall, wherein the fixing material is a plastic material adapted to be stressed under rubber elastic elongation and shear.

By virtue of the elastic connection between the front end face of the cylinder barrel and the rear cell wall of the pressure cell of the invention, only very small forces of deformation are transmitted to the metering diaphragm after setting of the plastic material, in spite of the simple fixing procedure. For this reason a basic value of an intrinsic spurious signal, as a consequence of an existing initial deformation, remains very small. Furthermore, the elastic connection permits the use of less expensive material for the rear cell wall which may be made of another material than the metering diaphragm. Upon pressurization of the front end cell wall from outside, this wall suffers a slight spherical indentation and, at the same time, the annular cylinder barrel is deformed into a conical barrel. This subjects the elastic plastic material, interconnecting the front end face of the cylinder barrel and the rear cell wall, to elongation or strain. Upon temperature variations and corresponding different radial expansions of the metering diaphragm and the rear cell wall which is made of a different material, the elastic plastic material is stressed in shear. Yet substantial indentations of the metering diaphragm and consequently any greater intrinsic spurious signals are avoided.

The rear cell wall, for instance, may consist of a glass plate with lead-in wires to contact the leads of the metering diaphragm or of an aluminum substrate plate of an electric hybrid circuit for direct contact with the leads of the metering diaphragm. It is also possible to replace the alumina substrate plate by a printed circuit board or a metal plate.

In a preferred embodiment of the novel pressure cell, the thickness of the metering diaphragm at most corresponds to 1/4, preferably at most to 1/20 of the thickness of the cylinder barrel. In this manner the deformation to which the metering diaphragm is subjected under pressure load is given in a specifically well defined way so that good reproducibility of the measuring results is warranted.

Silicone rubber is especially well suited as the fixing material for various applications, particularly so if it contains about 70% of silicone oil and up to 30% of a curing agent. An important characteristic, the small amount of hysteresis given, is of great advantage when quickly varying pressures are to be measured.

BRIEF DESCRIPTION OF THE DRAWING

The invention will be described further, by way of example, with reference to the accompanying drawing, which is an axial sectional elevation of an embodiment of a pressure cell according to the invention when subjected to pressure from outside.

DESCRIPTION OF THE PREFERRED EMBODIMENT

The pressure cell shown in the drawing consists of a front end cell wall constituting a metering diaphragm 1 and consisting, for example, of n-doped silicon. The backside of this cell wall passes over into a circular ring-shaped cylinder barrel 2. N-type resistors 3 are disposed either by diffusion or by coating on the outer surface of the metering diaphragm 1 and are connected by laminated lines 4 and contact points 5 with a lead 6 each. The kind of application of the resistors 3 and of the contacting are known in the art. The metering diaphragm 1 has a thickness which corresponds approximately to 1/20 of the thickness of the cylinder barrel 2 and is shown exaggerated in the drawing.

The rear face (in the drawing the lower one) of the cylinder barrel is cemented to a rear cell wall 7 of circular plate shape and made of metal. The material used for this fixation in an eleastic plastic material 8 adapted to be stressed under elongation or strain and shear, namely silicone caoutchouc applied as a layer between the front end face of the cylinder barrel and the cell wall.

If absolute pressure measurements are to be taken, the rear cell wall 7 is closed, if reference pressure measurements are to be taken, there is a hole or tube 9 passing through the center of the cell wall 7. When the rear cell wall is closed, the vacuum required for absolute pressure measurements in the interior of the pressure cell already must exist when the plastic material 8 is caused to set or cross-link, for example, under the influence of heat. However, cross-linking in the presence of a vacuum is difficult. It can be avoided by using a cell wall provided with hole, as used for reference pressure measurements, also for absolute pressure measuring cells and by evacuating the interior of the pressure cell through this hole upon cross-linking of the plastic material 8. Then the hole may be closed.

The cell wall 7 comprises lead-in wires 6' which are fused gas-tight in glass and serve to contact the leads 6. A casing 10 and a supply tube 11 for pressurization of the pressure cell with a pressure P are mounted in gas-tight manner on the cell wall 7.

The drawing shows the pressure cell under the influence of the pressure P, i.e. in deformed state (shown greatly exaggerated). As can be seen, the front cell wall 1 is depressed spherically and the cylinder barrel is deformed into a frustum of a cone. The layer of plastic material 8 is deformed into wedge shape.

It is obvious that the front end cell wall 1 is planar when not loaded, that the cylinder barrel is cylindrical as its designation indicates, and that the layer of plastic material 8 has a rectangular instead of a wedge-shaped cross section.

The arrangement may also be made such that the casing 10 is closed and no supply tube 11 is provided. Pressurization then is effected from the inside through the tube 9 passing through the center (absolute pressure measurement).

When the diaphragm 1 is deformed under the influence of pressure the resistance of the resistors 3 changes correspondingly. The change of resistance may be sensed and transformed into a corresponding electrical signal in known manner by means of an electrical measuring circuit connected to the lead-in wires.

What we claim is:

1. A piezoresistive pressure cell of generally cylindrical shape, comprising a front end cell wall constituting a metering diaphragm having at least one strain-responsive resistor secured thereon, said front cell wall consisting essentially of a solid insulating material, and which extends over an annular cylinder barrel portion having a uniform wall thickness substantially greater than the cross-sectional thickness of said metering diaphragm, said pressure cell further comprising a rigid rear cell wall upon which the cylinder barrel portion is sealed by a fixing material applied between the cylinder barrel end face and the rear cell wall, wherein the fixing material is a plastic material adapted to undergo stresses including rubber elastic elongation and shear.

2. The pressure cell as defined in claim 1 wherein the rear cell wall is selected from a rigid material other than that of the metering diaphragm.

3. The pressure cell as defined in claim 1 wherein the thickness of the metering diaphragm corresponds to a ratio of between 1/4 and 1/20 of the wall thickness of the cylinder barrel.

4. The pressure cell as defined in claim 1 wherein the fixing material is silicone rubber.

5. The pressure cell as defined in claim 4 wherein the silicone rubber fixing material has a Shore hardness of about 35+, a modulus of elasticity of about 40 N/cm$^2$ at 150% change in length, and an elongation prior to rupture of about 300%.

* * * * *